United States Patent
Deshmukh et al.

(10) Patent No.: US 6,753,118 B2
(45) Date of Patent: Jun. 22, 2004

(54) OPTICAL GRATING FABRICATION PROCESS

(75) Inventors: Rajan D. Deshmukh, Pennington, NJ (US); Benjamin J. Eggleton, Summit, NJ (US); Pavel Ivanoff Reyes, Murray Hill, NJ (US); Carl Soccolich, Flemington, NJ (US); Michael Sumetsky, Bridgewater, NJ (US); Paul S. Westbrook, Chatham, NJ (US)

(73) Assignee: Fitel USA Corp., Norcross, GA (US)

( * ) Notice: Subject to any disclaimer, the term of this patent is extended or adjusted under 35 U.S.C. 154(b) by 252 days.

(21) Appl. No.: 10/109,411

(22) Filed: Mar. 27, 2002

(65) Prior Publication Data

US 2003/0186142 A1 Oct. 2, 2003

(51) Int. Cl.[7] .............................. G03F 7/20; G02B 5/18; G03B 6/34
(52) U.S. Cl. ..................... 430/30; 290/321; 359/569; 385/37
(58) Field of Search ....................... 430/30, 290, 321; 359/569; 385/37

(56) References Cited

U.S. PATENT DOCUMENTS

| | | | |
|---|---|---|---|
| 5,384,884 A | 1/1995 | Kashyap et al. | |
| 5,822,479 A | 10/1998 | Napier et al. | |
| 5,832,156 A | 11/1998 | Strasser et al. | |
| 5,999,671 A | 12/1999 | Jin et al. | |
| 6,072,926 A | * 6/2000 | Cole et al. | 385/37 |
| 6,081,640 A | * 6/2000 | Ouellette et al. | 385/37 |
| 6,084,998 A | 7/2000 | Straayer | |
| 6,097,862 A | 8/2000 | Abramov et al. | |
| 6,108,470 A | 8/2000 | Jin et al. | |
| 6,130,766 A | 10/2000 | Cao | |
| 6,201,907 B1 | 3/2001 | Farries | |
| 6,269,208 B1 | 7/2001 | Bhatia et al. | |
| 6,272,886 B1 | 8/2001 | Novack et al. | |
| 6,275,629 B1 | 8/2001 | Eggleton | |
| 6,284,437 B1 | 9/2001 | Kashyap | |
| 6,295,396 B1 | 9/2001 | Cao et al. | |
| 6,307,679 B1 | 10/2001 | Kashyap | |
| 6,307,988 B1 | 10/2001 | Eggleton | |
| 6,310,996 B1 | 10/2001 | Byron | |
| 6,322,938 B1 | 11/2001 | Cohn | |
| 6,334,013 B1 | 12/2001 | Laming et al. | |
| 2003/0186142 A1 | * 10/2003 | Deshmukh et al. | 430/30 |

* cited by examiner

*Primary Examiner*—Thorl Chea

(57) ABSTRACT

A grating fabrication process utilizes real-time measurement of a grating characteristic (such as, for example, grating period chirp, reflectivity, group delay) as a feedback error signal to modify the writing process and improve the characteristics of the finished grating. A test beam is launched through the optical medium during the writing process (or at the end of an initial writing process) and a particular characteristic is measured and used to generate a "corrective" apodization refractive index profile that can be incorporated with the grating to improve its characteristics. The improvements may be applied to a phase (or amplitude) mask used to write the grating (etching, local deformation, coating changes, for example), or the grating itself may be corrected using additional UV exposure, non-uniform annealing, non-uniform heating, and/or non-uniform tension—these techniques applied separately or in an intermittent sequence. The utilization of a "closed loop" grating fabrication process provides the ability to form gratings with finely tuned characteristics.

26 Claims, 5 Drawing Sheets

OPTICAL GRATING FABRICATION PROCESS

TECHNICAL FIELD

The present invention relates to the formation of grating structures in optical media and, more particularly, to the incorporation of a feedback mechanism to control the determination of specified grating characteristics during the grating writing process.

BACKGROUND OF THE INVENTION

Optical waveguide gratings, such as fiber Bragg gratings, are recognized as key components for many optical communication systems. In particular, a Bragg diffraction grating is a structure that has a periodic pattern of alternating high and low optical refractive index values. Bragg gratings are useful as a result of their ability to reflect a particular wavelength or "color" of light. The color that will be reflected by a grating is the color whose wavelength exactly matches twice the effective grating period.

It is well known that Bragg gratings may be formed by using an external source of optical radiation to create an interference pattern in the germanosilicate glass core of an optical fiber (or in any other suitable optical medium, such as an optical waveguiding substrate). In the bright sections of the interference pattern (where the interfering beams reinforce each other), the beams interact with germanium sites in the fiber core (waveguide) and change the value of the refractive index. In the dark sections of the interference pattern (where the interfering beams destructively interfere and cancel each other), the core refractive index will remain unchanged. Thus, the interference pattern creates a regular, periodic change in refractive index along a section of the core, forming a Bragg grating.

To provide greater flexibility in the design of fiber optic Bragg grating devices, techniques have been developed to write gratings by applying the optical radiation through the side of an optical fiber. One such technique, as illustrated in U.S. Pat. Nos. 4,725,110 and 4,807,950, involves splitting a laser beam into two sub-beams at a known and controllable angle within the core of the optical fiber (thus forming the interfering beams as discussed above). A second well-known technique described in the technical and patent literature involves focusing the laser beam on the fiber core through a grooved or patterned transmissive optical element referred to as a "phase mask". The phase mask holographically creates the required interference pattern in the fiber core.

The above-described techniques for producing optical fiber Bragg gratings are well established, but certain technical difficulties have prevented their use in large scale continuous or stepwise continuous production processes. U.S. Pat. No. 6,072,926 issued to M. Cole et al. on Jun. 6, 2000, discloses a method of writing gratings in an optical medium where both the medium and the phase mask are moved with respect to one another during the writing process, so as to vary the grating properties along the length of the grating, allowing for a relatively long, continuous grating to be formed. Relative movement in a single direction with this technique can result in a change in the grating pitch and, therefore, can be used to fabricate chirped or multi-wavelength gratings. Cole et al. also teaches the application of bi-directional dither to the fiber during the writing process to fabricate an apodized grating. "Apodization" is a technique of modifying the envelope of (in this case) the grating pattern to reduce the presence of the side lobes on either side of the main lobe in the pattern. When the grating is used as an optical filter (e.g., in a wavelength division multiplexed (WDM) system) the spacing of the grating pattern may be apodized such that the main lobe corresponds to a particular center wavelength, thus reducing the presence of optical crosstalk between channels. The apodization technique utilizes UV laser beams of relatively small width and is referred to in the art as "point-by-point" writing.

Phase and amplitude mask fabrication methods are also well-known in the art and include the UV exposure or holographic technique, electron beam writing technique, mechanical deformation, and others. See, for example, *Diffraction Gratings and Applications*, by E. G. Loewen et al., 1997.

While these and various other techniques continue to be developed and perfected to generate ever more complicated grating patterns, the accuracy and repeatability of such grating fabrication processes, as required for a high throughput manufacturing environment, remains problematic. Thus, a need remains in the art for a technique to improve the quality (in terms of accuracy and repeatability) of the various types of gratings written in optical media.

SUMMARY OF THE INVENTION

The need remaining in the prior art is addressed by the present invention, which relates to the formation of grating structures in optical media and, more particularly, to the incorporation of a feedback mechanism to control the determination of specified grating characteristics during the grating writing process.

In accordance with the present invention, a known grating characteristic (for example, grating period chirp, reflectivity and/or group delay) is measured during the writing process. The "error" between the expected result and the actual measured characteristic is determined using numerical algorithms known in the art of grating characterization and used as a feedback signal to the writing process. The feedback introduces a "correction" step in the writing process, to be used either during the current writing step, or as a "post-writing" correction process, to modify the written grating characteristic so as to more closely match the expected result.

In its most general terms, the corrective feedback technique of the present invention may be applied to the actual grating formed in the optical medium, or (if present) to the diffraction mask (phase or amplitude, for example) used to create the grating. Advantageously, if an error in the mask is discovered and "corrected", the remaining gratings formed using that mask will be free of the particular defect associated with the error (as indicated by, for example, the magnitude of the group delay ripple). The process of the present invention may be iterative, with multiple measurements and error signals generated in succession, until an optimum grating structure is achieved. This aspect is particularly well-suited for applications where it is desired to form a grating with tightly-controlled parameters. For example, the inventive corrective process may be used to continuously monitor and adjust the characteristics of a chirped grating to achieve a grating yielding a dispersion factor D on the order of 800 ps/nm, with a chirp linearity of better than 1 ps.

In one embodiment of the present invention, the "error" measured in a written grating may be used to correct the writing process, where the actual grating that exhibited the error is not corrected, but rather is discarded as a "test"

grating, that is, the grating used to determine the error between the parameters of the actual grating and the desired parameters.

In a specific embodiment of the present invention, the corrective feedback technique may be used to correct the group delay ripple associated with chirped fiber gratings. In this embodiment, the group delay characteristics are measured and the "ripple" is used to generate the correction for the DC and/or AC refractive index profile, defined as the corrective refractive index profile, or simply the corrective profile. A further, non-uniform UV exposure, non-uniform annealing, non-uniform heating and/or non-uniform applied tension, applied separately or in an intermittent sequence, can be used to a corrective profile.

Other and further aspects and embodiments of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
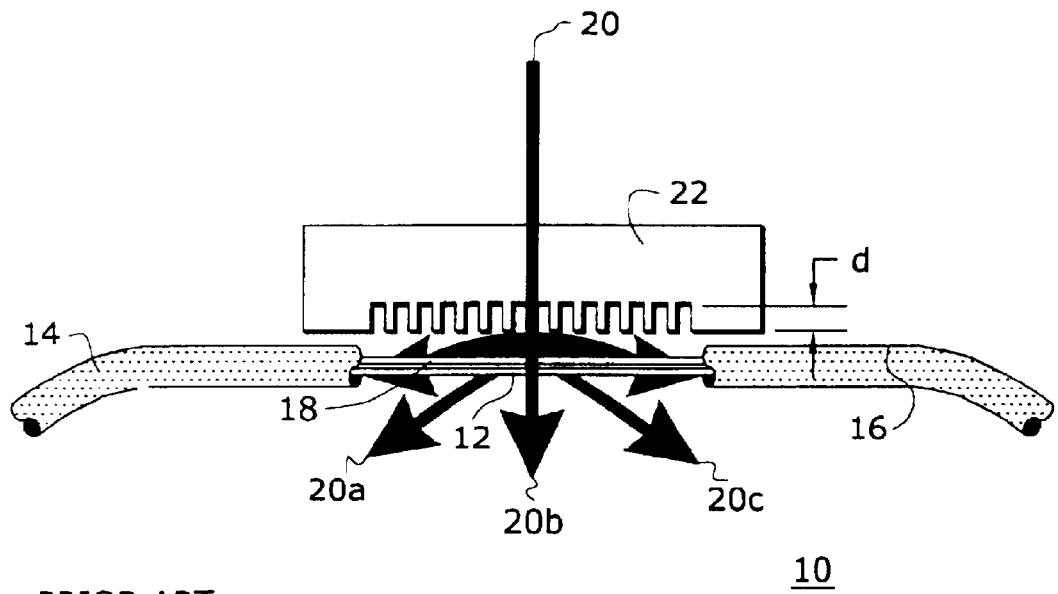
FIG. 1 illustrates an exemplary prior art arrangement utilizing a phase mask to write a grating into an optical fiber.

Prior to describing the inclusion of a corrective feedback loop in a grating fabrication process, it is useful to understand in general terms an exemplary grating writing process, as well as the various parameters used in forming a grating structure. FIG. 1 illustrates, in simplified form, a prior art arrangement 10 that can be used to write a grating pattern 12 into an optical medium 14. In this case, medium 14 comprises a section of optical fiber, where the outer jacket material 16 has been removed to expose the core region 18 that is susceptible to the refractive index profile changes needed to form a Bragg grating.

Referring to FIG. 1, a beam of intense ultra-violet light 20 is incident normally upon a diffraction grating, for example a phase mask 22, where the depth d of the grating elements forming mask 22 is initially chosen to suppress the zero$^{th}$ order diffraction of normally incident light. Close behind phase mask 22 is located optical fiber 14, whose axis extends transversely with respect to the direction of the extent of the grating elements of phase mask 22. When the light is incident upon phase mask 22, it is divided into a number of separate beams of different diffraction order. In FIG. 1, just three of those beams are depicted, namely the −1 order diffraction beam 20a, the zero order diffraction beam 20b, and the +1 order diffraction beam 20c. The interference of these beams on core region 18 of fiber 14 then result in forming the changes in the refractive index profile necessary to form the Bragg grating. It is to be understood that an amplitude mask could also be used to induce the change in refractive index in the optical medium. For exemplary purposes only, the various embodiments discussed hereinbelow will refer to the use of a "phase mask", with the understanding that an amplitude mask, or any suitable diffraction grating, is equally applicable.

At times, it is beneficial to introduce "chirp" into a grating as it is being written in the optical medium, where "chirp" can be defined as a change in the periodicity of the grating elements along the optical axis. That is, the (optical) repeat distance $\Lambda$ of the written index perturbations is not constant as a function of the axial coordinate z of the fiber, i.e., if $\Lambda = \Lambda(z)$. The chirp of the grating serves to provide spatial dispersion of light propagating along core region 18 of fiber 14. The magnitude of the chirp is known to determine the dispersion, with the dispersion decreasing with increasing chirp.

In general, a conventional grating fabrication process is usually a multi-step process, where the errors in grating parameters may be introduced at each step in the manufacturing process. In particular, a conventional grating manufacturing process may consist of the following steps: (1) fabricating the required phase mask (using the steps of: coating a blank mask with resist, exposing the phase mask to delineate the desired grating pattern, developing the exposed phase mask, and etching the developed phase mask); then (2) fabricating the fiber grating (using the steps of: stripping the outer coating layers from the fiber, creating the grating in the fiber core by exposure using the phase mask, and annealing the fiber in the region of the created grating). The phase mask may or may not be used in fiber grating fabrication. In the absence of a phase mask, the periodic pattern is directly created in the core region of the fiber, using an interferometer, for example.

Figure 2:
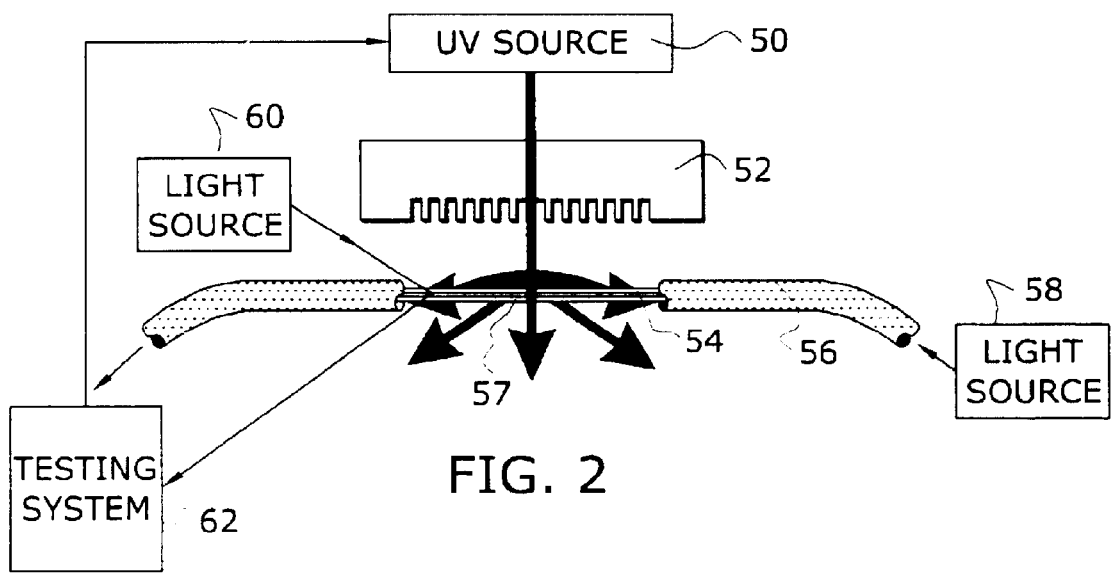
FIG. 2 illustrates an exemplary apparatus useful in performing a closed-loop corrective writing process in accordance with the present invention.
Figure 3:
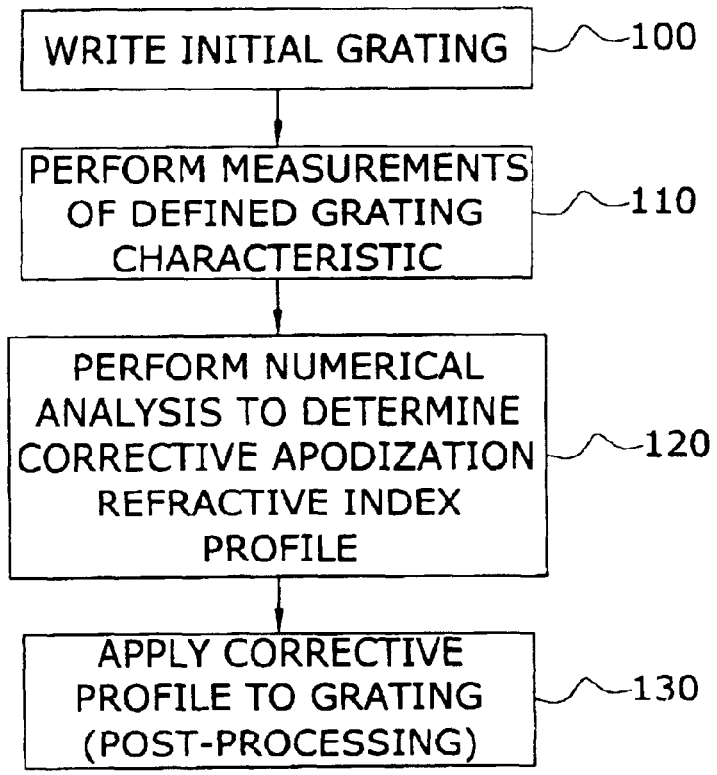
FIGS. 3–5 contain flow charts of various process sequences that may be used to provide the corrective grating technique of the present invention.
Figure 4:
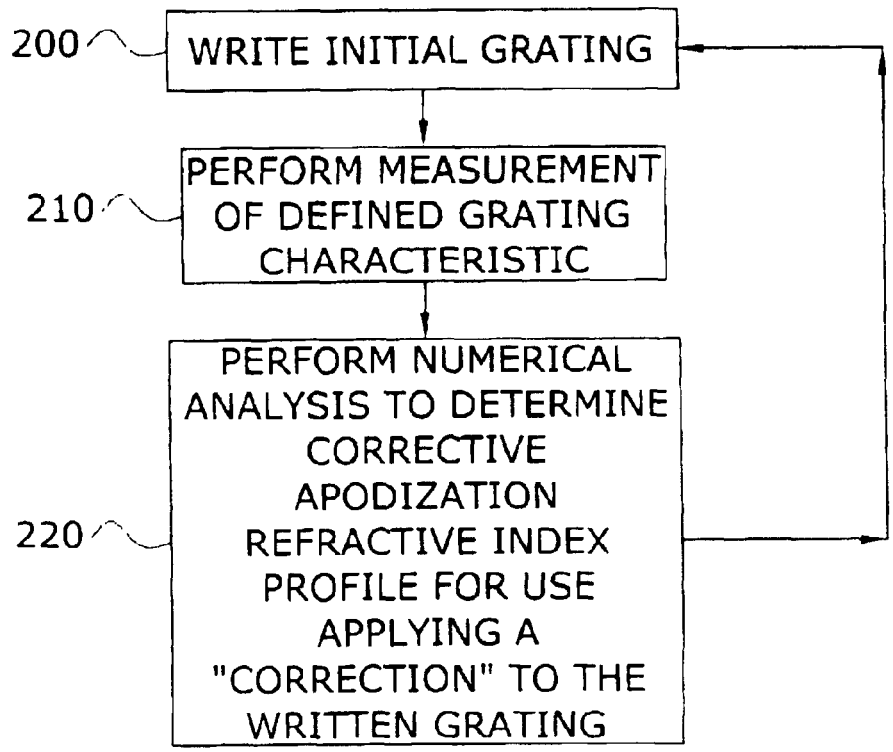
Figure 5:
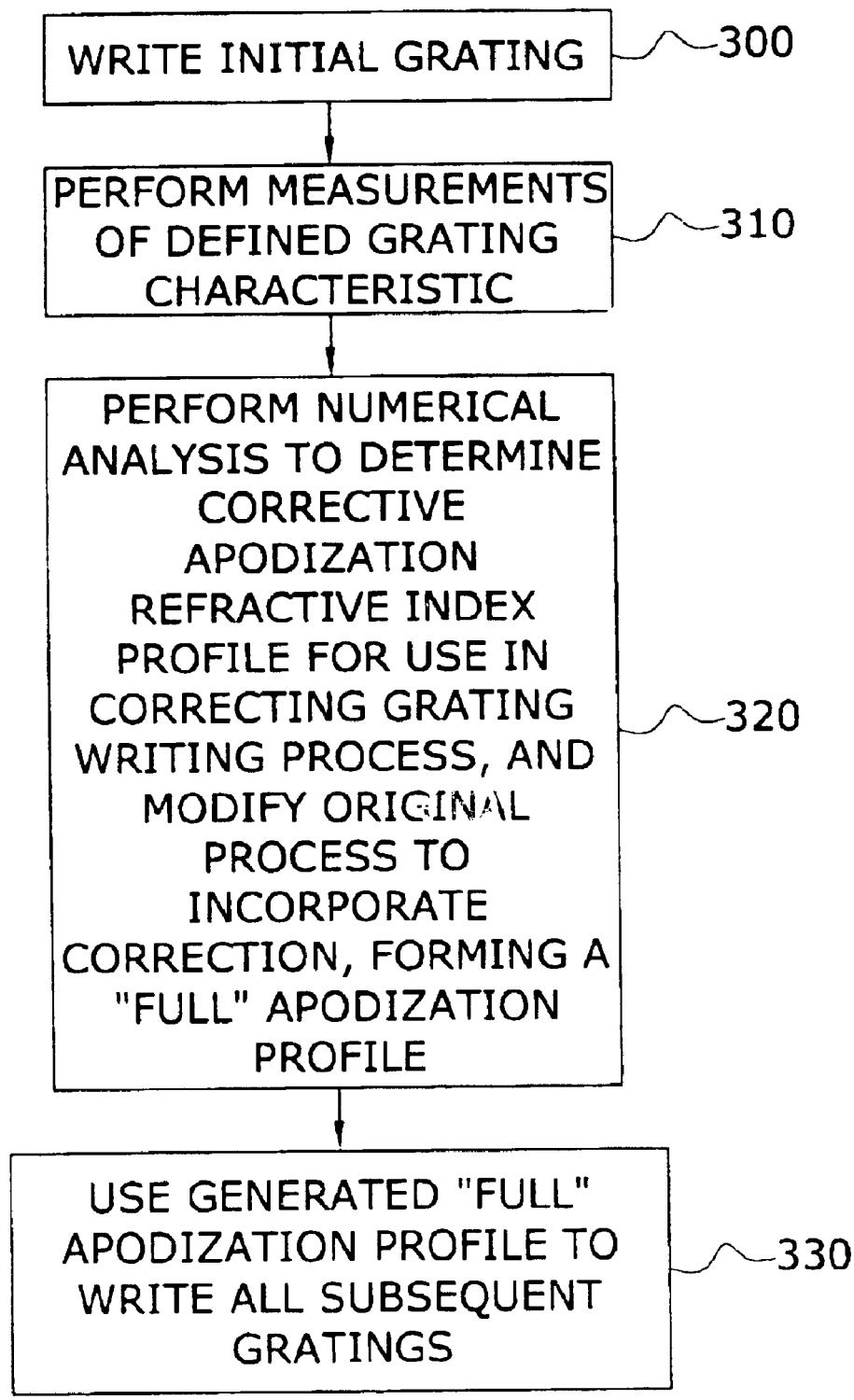

In order to improve the correspondence between the observed performance parameters of the gratings and the defined specifications, the corrective closed-loop process of the present invention may be used as follows, and as illustrated in the system of FIG. 2, which may use any of the corrective processes as illustrated in the flowcharts of FIGS. 3–5. The grating writing process of the present invention begins with an initial grating writing process where a UV radiation source 50 is used in conjunction with a mask 52 (for example, a phase mask or an amplitude mask) to create a holographic beam pattern which forms a pattern of regions of differing refractive index within the core region 54 of an optical fiber 56 to form a grating 57. The beam pattern exhibits a particular "refractive index profile", and can be defined by both its AC term, $\Delta n_{ac}$ and its DC term, $\Delta n_{dc}$, which are discussed in detail hereinbelow. Light sources 58, 60 (such as lasers, for example), are positioned to launch a test beam along the optical axis of fiber 56 so as to pass through grating structure 57 being written into core region 58. A testing system 62 is disposed to capture at least a portion of the radiation as it exits grating 57, where testing system 62 is particularly configured to measure a predefined aspect of the grating (e.g., grating period chirp, reflectivity, group delay). Testing system 62 then compares the measured characteristic against a specified "expected value", and determines the correction (if any) that needs to be made to grating 57 to bring the measured value closer to the expected value. As discussed above and will be discussed in detail below, there are various ways to modify the characteristics of a grating, where in some cases the phase mask may be modified and in other cases the grating itself may be modified. In general, FIG. 2 illustrates a correction signal connection between the output of testing system 62 and UV radiation source 50, phase mask 52 and grating 57, since each of these components may be adjusted to provide the necessary correction.

Referring to FIG. 3, one exemplary corrective grating fabrication process of the present invention involves an initial step 100 of writing a grating in a conventional manner, such as by using UV exposure apparatus 50 in FIG. 2, with a phase mask 52 to form a grating 57 in core region 54 of fiber 56. In general, and as is conventional in prior art processing, an initial grating is written by directing optical radiation onto the optical medium (e.g., fiber) to induce a spatially periodic perturbation of the refractive index in the core of the optical medium. The periodic perturbation can be formed by using a spatially periodic intensity pattern generated in the radiation (as by using a phase mask), or by using a relatively narrow UV laser beam to directly write, in a point-by-point method, the refractive index perturbation in the optical medium. Referring back to FIG. 3, the next step in this exemplary corrective process is to measure a particular characteristic (e.g., grating period chirp, reflectivity, group delay) in the created grating (step 110). Referring to FIG. 2, a test beam source 58 is included in the apparatus and used to launch a light wave along fiber 56 and through grating 57. Alternatively, test beam source 60 may be used to provide a side-illumination beam that impinges grating 57 to generate a scattered beam pattern that can be captured and evaluated by testing system 62. That is, testing system 62 is configured to both measure the selected characteristic associated with grating 57 and determine, using appropriate algorithms, the correction apodization profile that can be used to modify grating 57 to minimize the difference between the measured value and the expected value (step 120 in the process as shown in FIG. 3). Step 130 in the process, therefore, involves post-processing of grating 57 to correct the error. The corrective actions may involve performing an additional non-uniform UV exposure from source 50, non-uniform annealing, non-uniform heating, and/or non-uniform applied tension (these different techniques being applied separately, or in an intermittent manner) along a selected region of grating 57 to improve $\Delta n_{dc}$ or $\Delta n_{ac}$.

FIG. 4 illustrates an alternative grating correction process of the present invention, which uses a real-time correction to modify the grating as it is being written. In particular, a first step 200 is used to write the initial grating (as in conventional processes). As the grating is being written, test beam source 58 is used to launch a light wave through the grating 57, with testing system 62 measuring the specific characteristic being studied in the grating (step 210). A correction apodization profile is calculated, and this information is fed back to exposure apparatus 50 to modify the grating writing process. The modification may include modifying phase mask 52 and/or the parameters associated with the UV exposure source 50. In this example, a "real time" correction is performed and, in general, the process may be repeated numerous times until a grating with an acceptable measured characteristic is formed.

FIG. 5 illustrates an alternative grating correction process of the present invention. As with the other processes, an initial grating is written (step 300), followed by a measurement of the defined characteristic of the grating (step 310). The desired correction is calculated from this measurement, then incorporated with the original profile to form an "improved" full apodization profile (step 320), where this improved apodization profile is then used to writing all subsequent gratings (step 330). In this particular process, the original grating is merely used as a "test" grating and disposed of once the group delay ripple is measured.

In each of these processes, the correspondence between the observed performance parameters of the gratings and the specification can be corrected by a number of different methods. In general, a number of different techniques may be used to modify the phase mask to introduce the corrections into the grating structure. That is, the phase mask may be subject to permanent (or flexible) local deformations, local heating or local etching in the regions where a correction is necessary. In contrast to etching, a non-uniform thin film coating may be applied to the phase mask to alter the depth of the grooves in the mask. In general, a corrective process can include repeating the grating writing process with a corrected spatial DC and/or AC UV power variation, using the initial phase mask as a reference for determination of the required correcting power variation.

As mentioned above, a correction may also be applied directly to the grating, instead of correcting the phase mask used to write the grating. Like the modifications applied to the phase mask, the grating itself may also be subjected to local heating and/or permanent local deformation to impart the necessary correction to the refractive index profile. As discussed above, additional UV exposure and/or a local anneal process may be used to provide the desired modifications to the AC and DC portions of the refractive index profile. In general, the grating writing process may be repeated with a corrected spatial UV power variation, using the initial grating as a reference for the determination of the correcting UV power variation.

In order to improve the performance of chirped gratings, it is desirable to minimize the group delay ripple, $\Delta\tau(\Delta\lambda)$. "Group delay" can be defined as the transit time through a grating for a light beam operating at a particular wavelength. In most cases, this function should be essentially linear, in order to provide good dispersion compensation. "Group delay ripple", therefore, is a numerical quantification of the deviation of the measured group delay from this desired linear characteristic. In accordance with the present invention, it is possible to reduce the group delay ripple by improving the characteristics of the grating during the writing process using a "closed loop" approach. That is, after the grating is initially written or during the actual writing process, its group delay characteristics are measured and numerically treated. An associated software program can then generate the necessary "correction factors" and produce a corrective refractive index apodization profile to compensate for the group delay ripple present in the initial group delay. The correction is generated for the DC and/or AC refractive index components.

In general, and as discussed above, a grating is defined by the refractive index variation n(z) in the optical medium (such as a fiber core), which can be written as follows:

$$n(z) = n_0 + \Delta n_{dc} + \Delta n_{ac} \cos\left(\frac{2\pi}{\Lambda_0} z + 2\varphi(z)\right)$$

where $\Lambda_0$ and $n_0$ are the unperturbed grating period and refractive index of the fiber core, respectively. Additionally, $\Delta n_{dc}$ (z) is defined as the DC component of the index variation, $\Delta n_{ac}$ is the AC component (i.e., amplitude) of the index modulation and $\phi(z)$ is the phase, which defines the variation of the grating period (i.e., chirp). The electric field in the fiber can be written in the following form:

$$E(z) = u(z)\exp\left(\frac{i\pi}{\Lambda_0}z + i\varphi(z)\right) + v(z)\exp\left(-\frac{i\pi}{\Lambda_0}z - i\varphi(z)\right)$$

Functions u(z) and v(z) are defined as the slowly varying amplitudes of the forward and backward propagating fields, respectively, where they satisfy the following coupled-mode equations:

$$u'(z) = +i[\delta(z)u(z) + \kappa(z)v(z)]$$

$$v'(z) = -i[\delta(z)v(z) + \kappa(z)u(z)],$$

where $$\delta(z) = \Delta + \frac{\pi \Delta n_{dc}(z)}{n_0 \Lambda_0} - \varphi(z), \quad \kappa(z) = \frac{\pi \Delta n_{ac}(z)}{2n_0 \Lambda_0},$$

and the detuning parameter $\Delta$ is defined as follows:

$$\Delta = \frac{2\pi}{\lambda} - \frac{\pi}{\Lambda_0},$$

where $\lambda$ is defined as the wavelength of the radiation.

The reflectivity, $r(\Delta)$ is defined by the following relation:

$$r(\Delta) = \lim_{z \to -\infty} \frac{v(z)}{u(z)} e^{2i\Delta z}$$

and can be represented by its phase $\Psi(\Delta)$ and amplitude $A(\Delta)$ so that $$r(\Delta) = A(\Delta)\exp(i\Psi(\Delta)).$$

The correction procedure of the present invention includes correction of the ripple in the reflection amplitude and phase. The phase is commonly expressed through the group delay:

$$\tau(\Delta) = \frac{n_0}{c_0} \frac{d\Psi(\Delta)}{d\Delta},$$

where $c_0$ is the speed of light. In general terms, the process of the present invention is based on the fact that by introducing the proper corrections in $\Delta n_{dc}$ and $\Delta n_{ac}$, the corrections necessary to eliminate ripple by correcting $A(\Delta)$ and $\tau(\Delta)$ will occur, as illustrated in the following diagram

| Correction Of | yields | correction of |
|---|---|---|
| $\Delta n_{dc}$ | $\Rightarrow$ | $A(\Delta)$ |
| $\Delta n_{ac}(z)$ | | $\tau(\Delta)$ |

It should be noted that the more advanced correction using, for example, the point-by-point writing technique described above may also include correction of the phase $\phi(z)$, where this correction is either performed separately, or complementing the correction of $\Delta n_{dc}$ and $\Delta n_{ac}$.

A relatively simple illustration of the corrective writing process of the present invention can be given in the case where the group delay ripple comprises relatively low frequency components. This is the case when the group delay ripple is adiabatically smooth and the relation between the refractive index variation $\Delta n(z)$ and the corresponding group delay ripple $\Delta\tau(\Delta\lambda)$ can be defined by the following equation:

$$\Delta\tau(\Delta\lambda) = const \frac{\Lambda_0}{c_0 C} \Delta n\left(\frac{\Delta\lambda}{2n_0 C}\right),$$

where $\Delta\lambda$ is defined as the wavelength detuning, $n_0$ is the refractive index of the fiber, C is the chirp of the fiber grating period, and "const" is a constant with a value of approximately "2". A typical value for chirp should remain less than (or on the order of) 10 nm/cm (a preferred value being approximately 0.05 nm/cm), with a nominal grating period $\Lambda_0$ of 0.5 μm. The typical amplitude of the group delay ripple (that is, the DC component of the refractive index change) is then approximately 10 picoseconds. The above equation illustrates that in order to compensate this amplitude, the corrective feedback step of the present invention needs to introduce an additional refractive index change ($\Delta n$) of about $2 \times 10^{-5}$, which is approximately 10% of the regular apodization amplitude. Thus, for this particular example, the suggested correction is relatively easy to achieve.

The above equation also shows that the maximum possible group delay ripple amplitude that can be corrected, $\Delta\tau_{max}$, is limited by the maximum possible change in refractive index $\Delta n_{max}$, as well as the grating chirp C. Estimating $\Delta n_{max}$ to be approximately $10^{-3}$, this yields a $\Delta\tau_{max}$ of approximately $10^3$ ps, for C=31 0.05 nm/cm. This value drops proportionally to the value of chirp, C.

Figure 6:
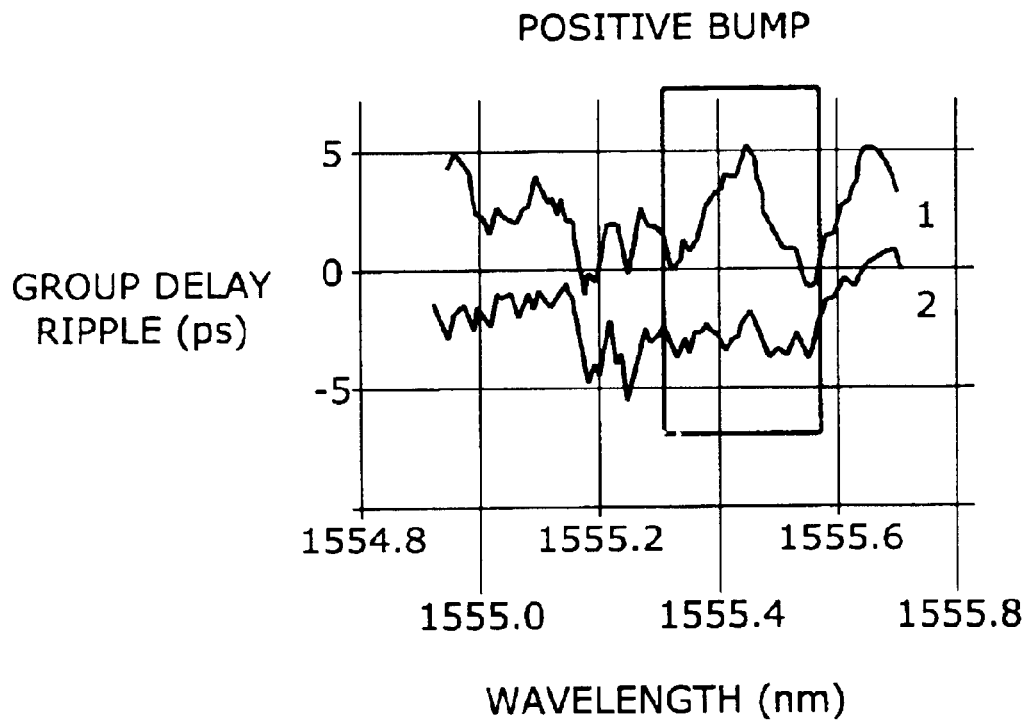
FIGS. 6–8 contain graphs illustrating the results of group delay ripple correction using a non-uniform UV radiation to correct a written grating.

In one of the process embodiments of the present invention, the permanent correction of group delay ripple was performed by using an additional non-uniform UV exposure process. The original grating had a period of approximately 500 nm, with a chirp of 0.05 nm/cm. The linear group delay introduced by this grating exhibited a slope (i.e., dispersion) of about 750 ps/nm. After the grating was fabricated, its spectrum was characterized and the average group delay ripple ($\Delta\tau_{av}(\Delta\lambda)$) over a 0.1 nm interval was calculated. The corrective index profile was then calculated for this averaged group delay ripple using the adiabatic method described above. The initial grating had an index modulation amplitude of approximately $2 \times 10^{-4}$, where the "corrective" profile required to trim the original group delay ripple was calculated to be less than (or on the order of) about 10% of this value, or about $10^{-5}$. FIG. 6 illustrates this use of a corrective application of non-uniform radiation to correct for a "positive pulse" in the group delay ripple characteristic of a written grating. Curve 1 in FIG. 6 contains a graph of the original group delay ripple, showing a positive pulse of approximately 5 ps in height and having a 0.1 nm half-width at a wavelength just beyond 1555.4 nm. Curve 2 in FIG. 6 contains a graph of the group delay ripple measured through the same grating subsequent to a non-uniform UV exposure, showing an overall reduction in group delay ripple, and a significant reduction in the presence of the positive pulse (where it becomes essentially non-existent).

Figure 7:
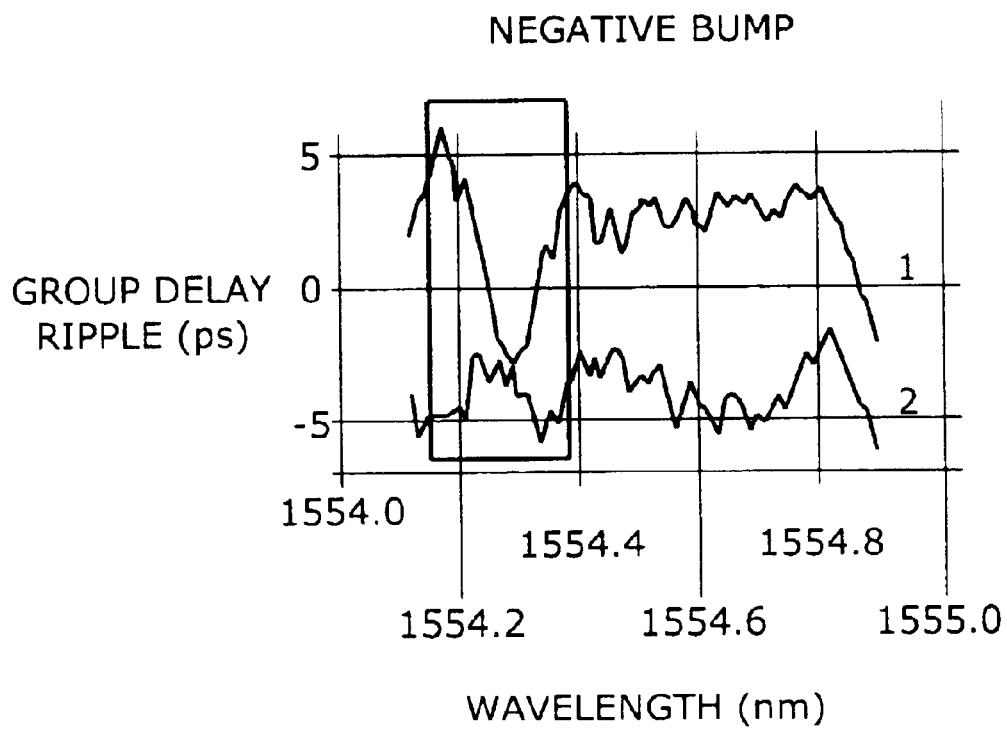
Figure 8:
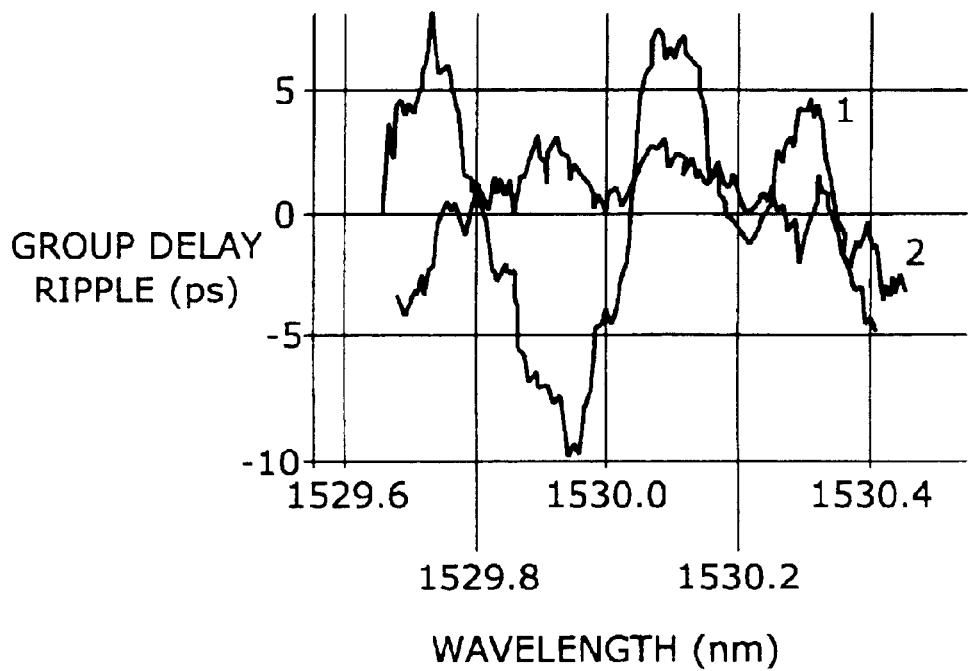

FIG. 7 contains a pair of graphs illustrating the group delay ripple for a grating (measured over a wavelength range of 1554–1555 nm), showing in curve 1 a significant negative pulse in the original grating measurement. The application of a non-uniform UV radiation apodization profile to this grating results in essentially removing this negative pulse, as evident in curve 2 of FIG. 7. FIG. 8 illustrates a pair of curves where a corrective apodization profile was used over the entire grating bandwidth to improve the group delay ripple, where curve 1 illustrates the group delay ripple prior to applying the corrective index profile and curve 2 illustrates the group delay ripple subsequent to applying the corrective index profile.

Figure 9:
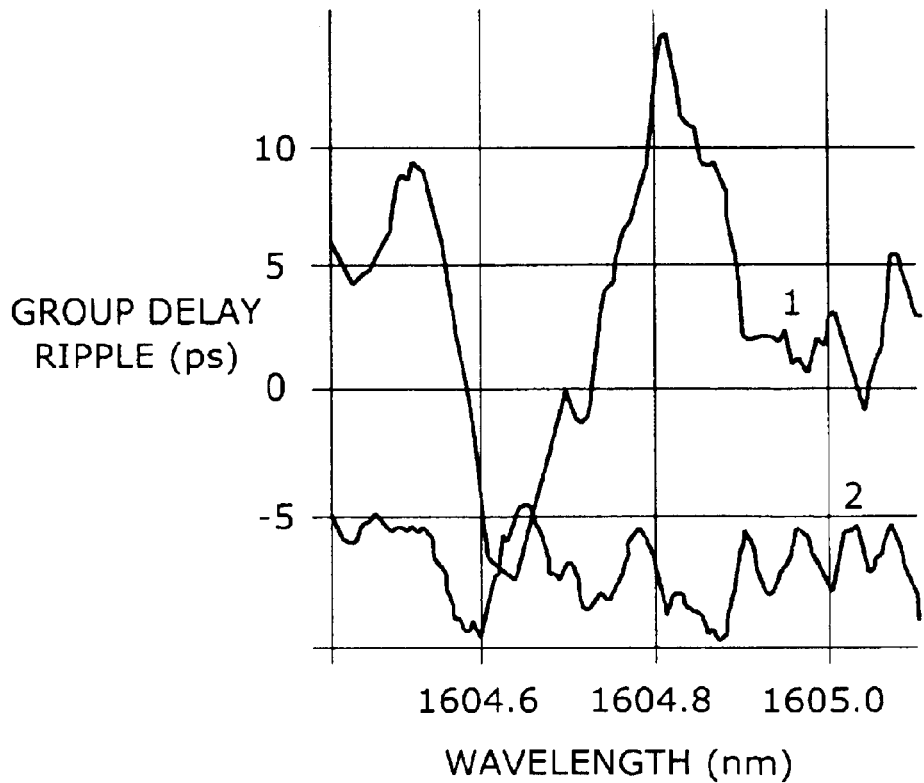
FIG. 9 contains a graph illustrating the results of group delay ripple correction using a non-uniform heating technique to correct a written grating in accordance with the present invention.

In another embodiment of the present invention, a flexible correction of the group delay was introduced by applying a non-uniform heating to a grating with similar period and chirp as discussed above. The correction was achieved in this case by tuning the temperature (within a few degrees) of six local heaters distributed along the length of the grating. The result of this non-uniform heating correction is shown in FIG. 9, where curve 1 illustrates the original group delay ripple, and curve 2 illustrates the corrected profile.

In all of these examples, the average group delay ripple was reduced from an original magnitude value of ±10 ps to less than ±2.5 ps. The correction was performed based on the approximate adiabatic solution of the inverse problem for the coupled wave equations, which is a valid presumption for the case of relatively smooth group delay ripple. It should be noted that the application of the rigorous theory described above allows for significant improvement in the accuracy of the correction, as well as the reduction of the residual ripple to value less than 1 ps, with a wavelength resolution on the order of 0.01 nm.

It is to be understood that these and other embodiments and configurations of the present invention are considered to be exemplary only, illustrating the principle of providing corrective feedback during the process of writing gratings in optical material. The subject matter of the present invention is considered to be limited only by the scope of the claims appended hereto.

What is claimed is:

1. A method of writing a grating in an optical medium comprising the steps of:
   a) directing optical radiation on the optical medium to induce a spatially periodic perturbation of the refractive index of said optical medium, forming an initial grating therein;
   b) propagating a test beam through the initial grating formed in step a);
   c) capturing at least a portion of the test beam after propagation through said initial grating and measuring a defined characteristic associated with said initial grating;
   d) comparing said measured characteristic against a specified value of said characteristic and generating a corrective profile associated with the difference between said measured characteristic and the specified value; and
   e) performing a grating correction process, based on said corrective profile, to reduce the difference between said measured characteristic and said specified value.

2. The method as defined in claim 1 wherein in performing step a), the initial grating is formed using narrow beam UV radiation to inscribe a point by point grating structure.

3. The method as defined in claim 1 wherein in performing step a), the initial grating is formed using UV radiation provided to generate a spatially periodic intensity pattern, the intensity pattern used to induce the spatially periodic perturbation of the refractive index grating pattern in the optical medium.

4. The method as defined in claim 3 wherein the UV radiation is passed through a diffraction mask to generate the spatially periodic intensity pattern.

5. The method as defined in claim 4 wherein the diffraction mask comprises a phase mask.

6. The method as defined in claim 4 wherein the diffraction mask comprises an amplitude mask.

7. The method as defined in claim 4 wherein in performing step e), the diffraction mask is altered to incorporate the corrective profile.

8. The method as defined in claim 7 wherein the diffraction mask is altered by applying a local deformation to said mask and the method includes the additional step of re-radiating the grating in the optical medium.

9. The method as defined in claim 7 wherein the diffraction mask is altered by etching certain diffraction elements to form to the corrective profile.

10. The method as defined in claim 7 wherein the diffraction mask is altered by applying a non-uniform thin film on the surface thereof to modify certain diffraction elements and form the corrective profile.

11. The method as defined in claim 1 wherein in performing step a), mechanical deformation is used in the radiation process.

12. The method as defined in claim 1 wherein in performing step a), mechanical groove inscription is used in the radiation process.

13. The method as defined in claim 1 wherein in performing step e), the grating formed in the optical medium in step a) is directly altered to incorporate the corrective profile.

14. The method as defined in claim 13 wherein the optical medium is subjected to a permanent local deformation to exhibit the corrective profile.

15. The method as defined in claim 13 wherein the optical medium is subjected to heating along its length to exhibit the corrective profile.

16. The method as defined in claim 13 wherein the optical medium is subjected to non-uniform heating along its length to exhibit the corrective profile.

17. The method as defined in claim 13 wherein the optical medium is subjected to additional UV exposure exhibit the corrective profile.

18. The method as defined in claim 13 wherein the fiber is subjected to a local annealing process to exhibit the corrective profile.

19. The method as defined in claim 1 wherein in performing step a) a chirped fiber grating is formed.

20. The method as defined in claim 19 wherein in performing step c), grating period chirp is the measured characteristic.

21. The method as defined in claim 19 wherein in performing step c), group delay is the measured characteristic.

22. The method as defined in claim 1 wherein steps b) through e) are repeated until a defined minimal difference between a measured characteristic and a specified value is achieved.

23. The method as defined in claim 22 wherein steps b) through e) are repeated to form a grating exhibiting a linearity of no greater than 1 ps.

24. The method as defined in claim 22 wherein in performing steps b) through 3), a phase mask is used in at least one process sequence.

25. The method as defined in claim 22 wherein in performing steps b) through e), an amplitude mask is used in at least one process sequence.

26. The method as defined in claim 22 wherein in performing steps b) through e), a phase mask is used in at least one process sequence and an amplitude mask is used in at least one process sequence.

* * * * *